United States Patent
Kelleher et al.

(10) Patent No.: US 7,710,741 B1
(45) Date of Patent: May 4, 2010

(54) RECONFIGURABLE GRAPHICS PROCESSING SYSTEM

(75) Inventors: Brian M. Kelleher, Palo Alto, CA (US); Ludger Mimberg, San Jose, CA (US); Anthony M. Tamasi, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1363 days.

(21) Appl. No.: 11/120,818

(22) Filed: May 3, 2005

(51) Int. Cl.
*H05K 1/11* (2006.01)
*H05K 1/14* (2006.01)

(52) U.S. Cl. .................. 361/803; 361/760; 361/785

(58) Field of Classification Search ........... 361/803, 361/679, 792, 748, 784–785, 788, 760; 439/55, 439/65, 607–608, 625–626, 629, 59, 61; 710/300, 301
See application file for complete search history.

(56) References Cited

U.S. PATENT DOCUMENTS

| | | | |
|---|---|---|---|
| 4,200,900 A | | 4/1980 | McGeorge |
| 4,602,316 A | | 7/1986 | Feick |
| 4,857,002 A | | 8/1989 | Jensen et al. |
| 4,969,066 A | | 11/1990 | Eibl et al. |
| 5,200,917 A | * | 4/1993 | Shaffer et al. ................ 365/51 |
| 5,493,542 A | | 2/1996 | Odelid et al. |
| 5,575,686 A | | 11/1996 | Noschese |
| 5,764,934 A | * | 6/1998 | Fisch et al. ................. 710/306 |
| 5,783,870 A | | 7/1998 | Mostafazadeh et al. |
| 5,951,665 A | * | 9/1999 | Crane et al. ................ 710/306 |
| 6,141,021 A | | 10/2000 | Bickford et al. |
| 6,152,213 A | | 11/2000 | Suzuki |
| 6,202,039 B1 | | 3/2001 | Finger |
| 6,222,739 B1 | | 4/2001 | Bhakta et al. |
| 6,313,984 B1 | | 11/2001 | Furay |
| 6,324,071 B2 | * | 11/2001 | Weber et al. ................. 361/785 |
| 6,331,939 B1 | | 12/2001 | Corisis et al. |
| 6,357,515 B1 | | 3/2002 | Bhatia |
| 6,380,616 B1 | | 4/2002 | Tutsch et al. |
| 6,450,250 B2 | | 9/2002 | Guerrero |
| 6,555,745 B1 | | 4/2003 | Kruse et al. |
| 6,570,561 B1 | | 5/2003 | Boesch et al. |
| 6,633,484 B1 | | 10/2003 | Lee et al. |
| 6,670,958 B1 | * | 12/2003 | Aleksic et al. .............. 345/502 |
| 6,671,177 B1 | | 12/2003 | Han |
| 6,724,389 B1 | | 4/2004 | Wilen et al. |
| 6,731,514 B2 | | 5/2004 | Evans |

(Continued)

FOREIGN PATENT DOCUMENTS

CA 2430040 12/2003

(Continued)

*Primary Examiner*—Hung S Bui
(74) *Attorney, Agent, or Firm*—Patterson & Sheridan, LLP

(57) ABSTRACT

One embodiment of a reconfigurable graphics processing system includes a first MXM edge connector and a second MXM edge connector affixed to an interposer board and a first MXM board and a second MXM board coupled to the interposer board via the first and second MXM edge connectors, respectively. Each MXM board includes a GPU and other elements necessary to process graphics data. The system couples to the motherboard of a computing device through an interface connector on the interposer board. One advantage of such a system is that it may be configured to deliver more performance than a standard desktop graphics board, while occupying substantially the same volume, through the use of multiple, small form factor MXM boards.

16 Claims, 5 Drawing Sheets

U.S. PATENT DOCUMENTS

| | | | |
|---|---|---|---|
| 6,731,515 B2 * | 5/2004 | Rhoads | 361/796 |
| 6,789,154 B1 * | 9/2004 | Lee et al. | 710/315 |
| 6,830,098 B1 | 12/2004 | Todd et al. | |
| 6,893,268 B1 | 5/2005 | Harari et al. | |
| 6,898,766 B2 * | 5/2005 | Mowery et al. | 716/1 |
| 6,924,437 B1 | 8/2005 | Creekmore et al. | |
| 7,005,586 B1 | 2/2006 | Duley | |
| 7,007,159 B2 | 2/2006 | Wyatt | |
| 7,024,601 B2 | 4/2006 | Quinlan et al. | |
| 7,045,890 B2 | 5/2006 | Xie et al. | |
| 7,061,087 B2 | 6/2006 | Kim | |
| 7,065,651 B2 * | 6/2006 | Evans | 713/189 |
| 7,102,892 B2 | 9/2006 | Kledzik et al. | |
| 7,274,572 B2 * | 9/2007 | Wang et al. | 361/719 |
| 7,340,557 B2 * | 3/2008 | Kong et al. | 710/316 |
| 2002/0097234 A1 | 7/2002 | Sauber | |
| 2003/0131172 A1 | 7/2003 | Lin et al. | |
| 2003/0205363 A1 | 11/2003 | Chu et al. | |
| 2004/0012082 A1 | 1/2004 | Dewey et al. | |
| 2004/0188065 A1 | 9/2004 | Shook et al. | |
| 2004/0228365 A1 | 11/2004 | Kobayash | |
| 2004/0246198 A1 | 12/2004 | Sahash | |
| 2005/0190536 A1 | 9/2005 | Anderson et al. | |
| 2005/0270298 A1 * | 12/2005 | Thieret | 345/502 |
| 2005/0273824 A1 | 12/2005 | Matic | |
| 2006/0274073 A1 * | 12/2006 | Johnson et al. | 345/531 |
| 2007/0224844 A1 * | 9/2007 | Chuang et al. | 439/55 |
| 2007/0294458 A1 * | 12/2007 | Danilak | 710/313 |

FOREIGN PATENT DOCUMENTS

| | | |
|---|---|---|
| EP | 1372069 | 12/2003 |
| WO | WO 03/092267 | 11/2003 |

* cited by examiner

US 7,710,741 B1

RECONFIGURABLE GRAPHICS PROCESSING SYSTEM

RELATED APPLICATIONS

This application relates to application Ser. No. 10/822,013, titled "Edge Connector for Field Changeable Graphics System" and filed on Apr. 9, 2004 and application Ser. No. 10/822,014, titled "Field Changeable Graphics System for a Computing Device" and filed on Apr. 9, 2004 (herein after referred to as the "MXM Board Applications"). The subject matter of these related applications is hereby incorporated by reference.

BACKGROUND OF THE INVENTION

1. Field of the Invention

Embodiments of the present invention relate generally to computer graphics and more particularly to a reconfigurable graphics processing system.

2. Description of the Related Art

Contemporary computing devices typically incorporate a separate graphics card that enables rapid graphics processing for graphics-intensive applications, such as gaming applications. A graphics card generally comprises a printed circuit board (PCB), upon which a plurality of circuit components (such as memory chips and the like) and a graphics processing unit (GPU) are mounted. Graphics cards are typically designed to conform to a card specification, such as the peripheral component interconnect express (PCI Express) or accelerated graphics port (AGP) card specifications that enable the graphics cards to be used in a variety of computing devices. These card specifications control, among other things, the physical characteristics of graphics cards, such as the board outline, connector placement, maximum component height and the like.

One drawback to a PCI Express or AGP graphics card design is that the graphics card usually has to be redesigned each time the GPU is upgraded. In particular, new GPU designs typically require that circuit components be rearranged on the graphics card to accommodate the upgraded GPU, requiring a substantial amount of cost and engineering effort. Also, the time required to redesign a graphics card can be significant due to the amount of research, signal analysis and the like that each new graphics card requires. Typical design cycle times may be between nine and twelve months. The long design cycle time limits the pace at which new GPU technologies can be introduced into the marketplace.

As the foregoing illustrates, there is a need in the art for a graphics board design that can be quickly and inexpensively reconfigured when the GPU is upgraded.

SUMMARY OF THE INVENTION

One embodiment of a graphics processing system includes an interposer board and a first graphics subsystem connector attached to the interposer board. The interposer board is configured to connect to a motherboard of a computing device, and the first graphics subsystem connector is configured to electrically couple a first graphics subsystem to the interposer board. The first graphics subsystem includes a first GPU coupled to a first graphics board, and the first graphics subsystem connector is adapted to receive at least a portion of the first graphics board.

One advantage of the disclosed system is that it may be quickly reconfigured with the latest GPU design by simply replacing an old graphics subsystem with a new graphics subsystem implementing the upgraded GPU. Since the design of the graphics subsystem connector may be standardized, the interposer board and related assembly do not need to be redesigned to accommodate the upgraded GPU. Another advantage is that the use of multiple, small form factor graphics subsystems enables the disclosed system to be configured to deliver greater performance than a standard desktop graphics card while occupying substantially the same volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
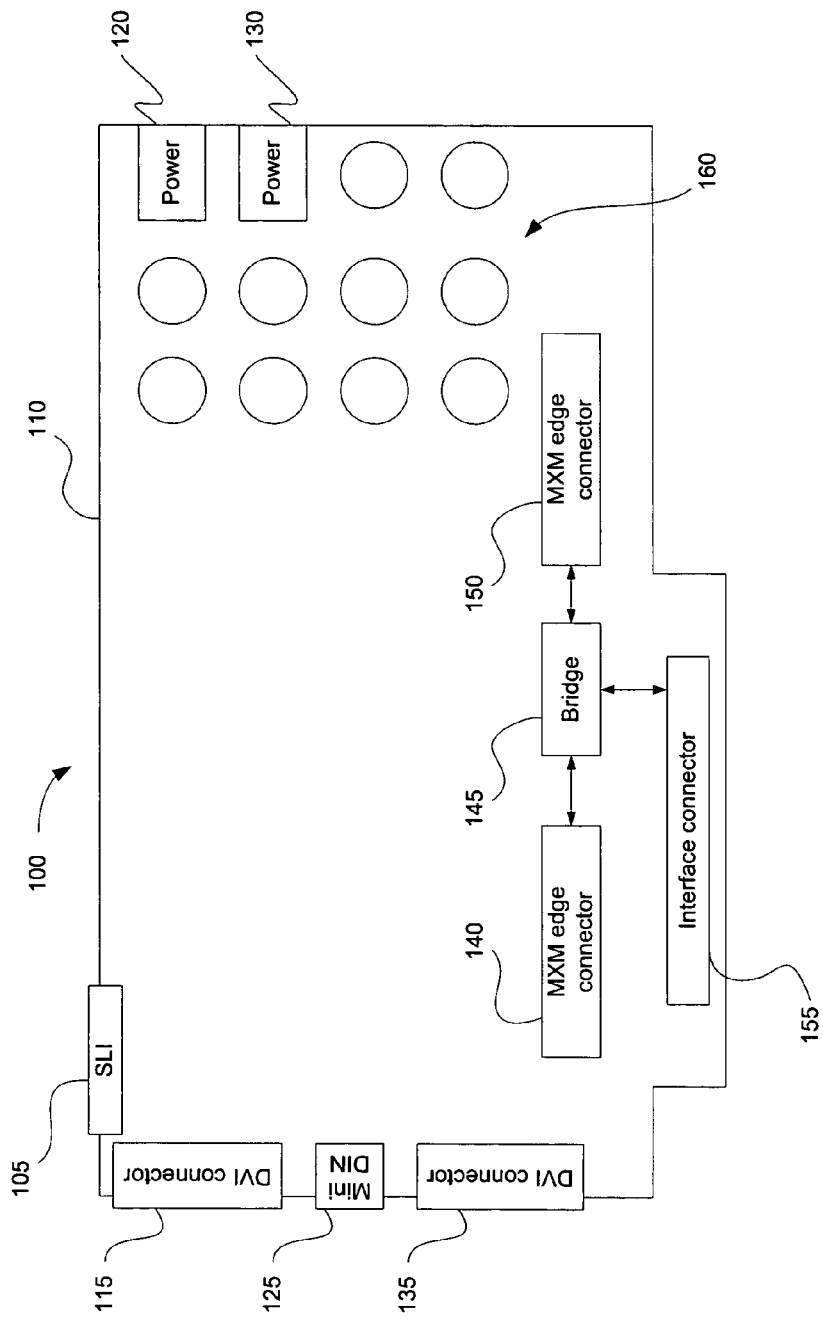
FIG. 1 is a conceptual illustration of an interposer board assembly, according to one embodiment of the invention.

FIG. 1 is a conceptual illustration of an interposer board assembly 100, according to one embodiment of the invention. As shown in FIG. 1, the interposer board assembly 100 includes, without limitation, an interposer printed circuit board (PCB) 110, a first MXM edge connector 140, a second MXM edge connector 150, an interface bridge 145, a scaleable link interface (SLI) expansion connector 105, a first output connector 115, a second output connector 125, a third output connector 135, an interface connector 155, a first power connector 120, a second power connector 130, and electronic components 160.

In the preferred embodiment, the interposer PCB 110 and the interface connector 155 are configured to conform to PCI Express or AGP card specifications which define, among other things, the board outline, electronic component height, interface connector placement, electrical signaling characteristics and the like. This enables the interposer board assembly 100 to be used in any expansion slot present on a computing device that is configured to accept a standard PCI Express or AGP card. The interface connector 155 couples the interposer PCB 110 directly to the motherboard of the computing device. In alternative embodiments, the interposer PCB 110 may conform to other card specifications or may not conform to any card specifications.

The first MXM edge connector 140 and the second MXM edge connector 150 are affixed to the interposer PCB 110. Each MXM edge connector is configured to couple an MXM board (not shown) to the interposer board assembly 100 such that graphics related signals may be transmitted from the MXM board to the interposer board assembly 100 and from the interposer board assembly 100 to the MXM board via the MXM edge connector. Detailed descriptions of the first MXM edge connector 140 and second MXM edge connector 150 are set forth in the MXM Board Applications. Alternative embodiments of the interposer board assembly 100 may include only a single MXM edge connector or more than two MXM edge connectors.

The first MXM edge connector 140 and the second MXM edge connector 150 are coupled to the bridge interface 145. The bridge interface 145 is further coupled to the interface connector 155. The bridge interface is used to adapt the bus signaling protocol present on the interface connector 155 to the bus signaling protocol required by the MXM boards (not shown) coupled to the first MXM edge connector 140 and the second MXM edge connector 150. In alternative embodiments, the bus signaling protocol may not need modification and the bridge interface 145 may be omitted, allowing the first MXM edge connector 140 and the second MXM edge connector 150 to be coupled directly to the interface connector 155. For example, if the interface connector 155 were configured to be a 16 lane PCI Express connector, a first group of eight lanes of PCI Express could be coupled to the first MXM edge connector 140 and a second group of eight lanes of PCI Express could be coupled to the second MXM edge connector 150.

The first output connector 115, the second output connector 125 and the third output connector 135 are electrically coupled to the first MXM edge connector 140 and the second MXM edge connector 150 through the circuitry on interposer PCB 110 (not shown). The output connectors 115, 125 and 135 are configured to deliver graphics data to graphics displays devices such as LCDs, CRTs, video monitors and the like. Output connector 115 and 135 are digital video interface (DVI) display connectors, and output connector 125 is a mini DIN connector commonly used for s-video output. In alternative embodiments, the connectors 115, 125 and 135 may be other input or output connectors such as DB15, BNC, RCA jacks or the like. Further, alternative embodiments may include more or less than three connectors. In the preferred embodiment, placement of the output connectors 115, 125 and 135 on the interposer PCB 110 is, in part, determined by the PCI Express or AGP specification.

The SLI expansion connector 105 may be used to link interposer board assembly 100 to other interposer board assemblies or to other graphics cards, thereby allowing a graphics rendering task to be distributed across more than one interposer board assembly or across multiple GPUs on the same type of PCB or on different types of PCBs. Input power connectors 120 and 130 are affixed to the interposer PCB 110 and enable additional power to be delivered to the interposer board assembly 100 when power beyond that delivered though the interface connector 155 is required. Again, alternative embodiments may include more or less than two power connectors and may omit the SLI expansion connector 105. Various electronic components 160 are affixed to the interposer PCB 110 to support the circuitry on the interposer PCB 110, including the circuitry of the first MXM edge connector 140 and the second MXM edge connector 150. Electronic components 160 may include components such as voltage regulators, capacitors, resistors and the like.

Figure 2:
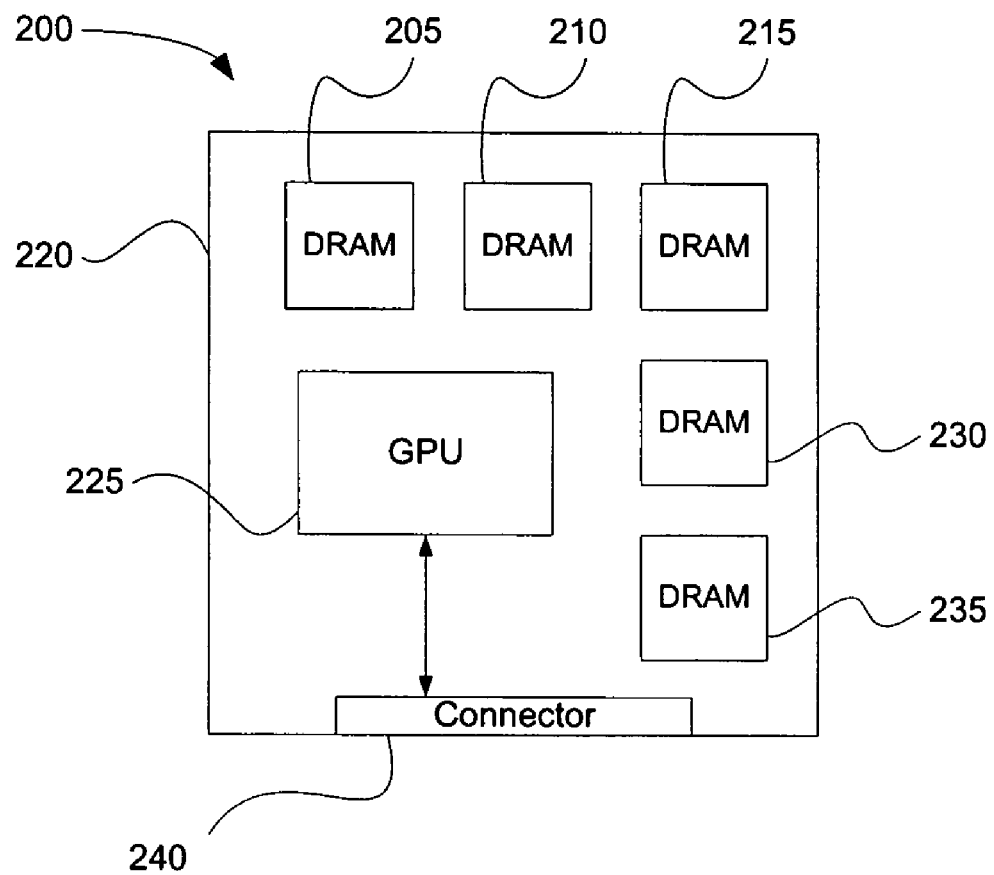
FIG. 2 is a conceptual illustration of an MXM board, according to one embodiment of the invention.

FIG. 2 is a conceptual illustration of an MXM board 200, according to one embodiment of the invention. The MXM board 200 is a graphics subsystem and, as previously indicated, detailed descriptions of the MXM board 200 are set forth in the MXM Board Applications. As shown, the MXM board 200 includes, without limitation, a PCB 220, a GPU 225, memories 205, 210, 215, 230, 235 and a card connector 240. The GPU 225 is affixed to the PCB 220, which couples the GPU 225 to the card connector 240. Signals to control and program the GPU 225 are received from the interposer board assembly 100 (not shown) via the MXM edge connector (not shown) and input from the card connector 240 to the GPU 225, and the graphics data processed by the GPU 225 is output from the GPU 225 to the card connector 240 and then transmitted to the interposer board assembly 100 via the MXM edge connector. This configuration allows graphics related signals to be transmitted between the interposer board assembly 100 and the GPU 225 when the MXM board 200 is coupled to either of the first MXM edge connector 140 or the second MXM edge connector 150, as the case may be. The GPU 225 is further coupled to memories 205, 210, 215, 230 and 235 and uses the memory for the storage of GPU instructions, graphics data and the like.

Figure 3:
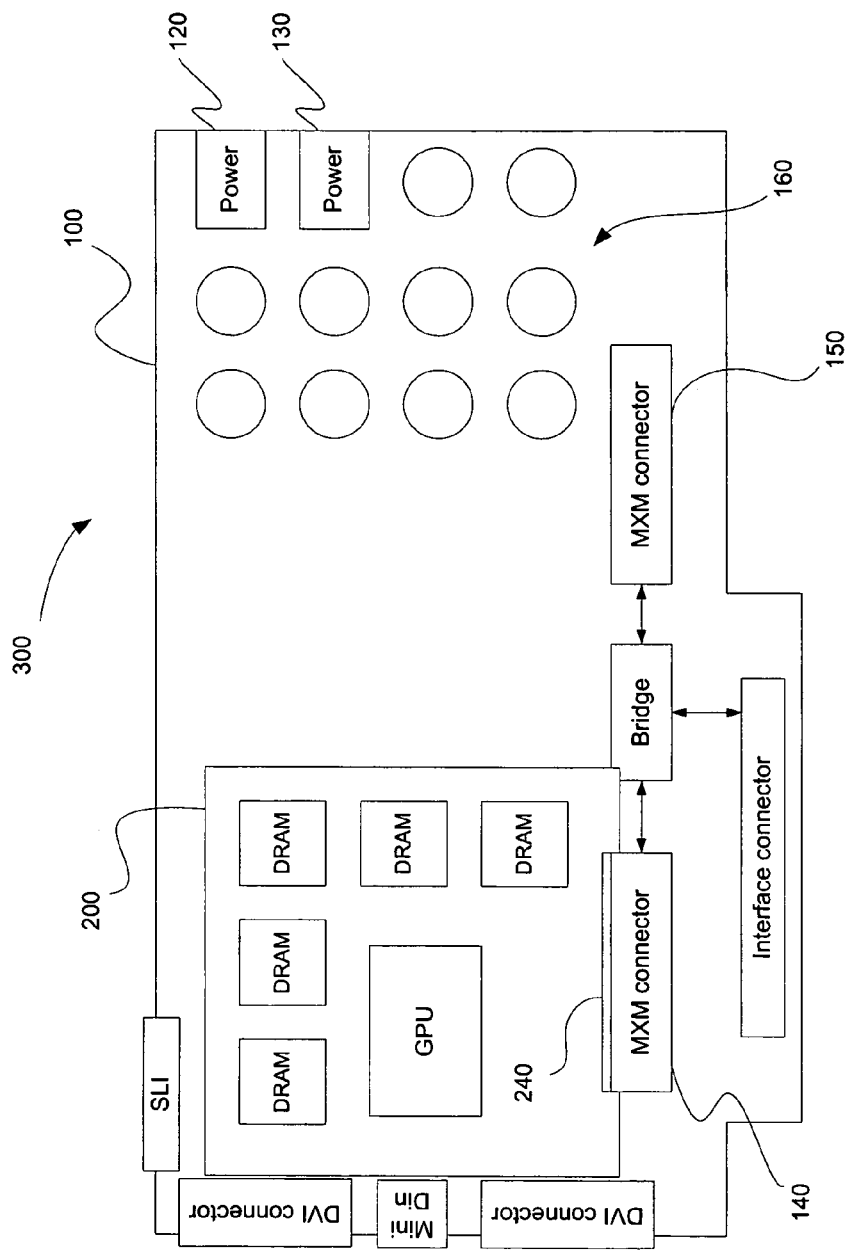
FIG. 3 is a conceptual illustration of reconfigurable graphics processing system, according to one embodiment of the invention.

FIG. 3 is a conceptual illustration of a reconfigurable graphics processing system 300, according to one embodiment of the invention. As shown, the reconfigurable graphics processing system 300 includes, without limitation, the MXM board 200 of FIG. 2 coupled to the interposer board assembly 100 of FIG. 1 via the MXM edge connector 140. Although only one MXM board 200 is shown, in a preferred embodiment, reconfigurable graphics processing system 300 includes a second MXM board coupled to the interposer board assembly 100 via the MXM edge connector 150. Using two MXM boards in a single reconfigurable graphics processing system 300 allows graphics rendering tasks to be shared across two GPUs. A thermal solution (not shown) can be configured to cool the MXM boards 200 and may be coupled directly to the MXM boards 200 or to the interposer board assembly 100. The physical dimensions of the thermal solution may be determined, in part, by the PCI Express or AGP specification.

Given that the MXM board 200 may be readily upgraded as the GPU design is upgraded, one advantage of the present invention is that the reconfigurable graphics processing system 300 may be quickly reconfigured with the latest GPU design by simply replacing an older MXM board with a newer MXM board. Since the design of the MXM edge connectors 140 and 150 are standardized, the interposer board assembly 100 does not need to be redesigned to accommodate the upgraded GPU. Another advantage is that the reconfigurable graphics processing system 300 may be configured to deliver more performance than a standard desktop graphics card while occupying substantially the same volume. More specifically, the MXM board 200 has a small form factor since it is intended for use in laptop computers. Because of this small form factor, the reconfigurable graphics processing system 300 may include two MXM boards, thereby providing the user with a high-performance graphics system comprising two GPUs while occupying the approximate volume of a standard desktop graphics card.

Although the embodiments shown contemplate MXM edge connectors and MXM boards, alternative embodiments may include any type of graphics subsystem having a graphics processing unit coupled to a PCB and any type of graphics subsystem connector attached to the interposer PCB 110 and configured to electrically couple the graphics subsystem to the interposer PCB 110. Further, alternative embodiments may include a general purpose graphics processing subsystem, as opposed to a graphics subsystem, having a general purpose or other processing unit coupled to a PCB and any type of subsystem connector attached to the interposer PCB 110 and configured to electrically couple the general purpose processing subsystem to the interposer PCB 110.

Figure 4:
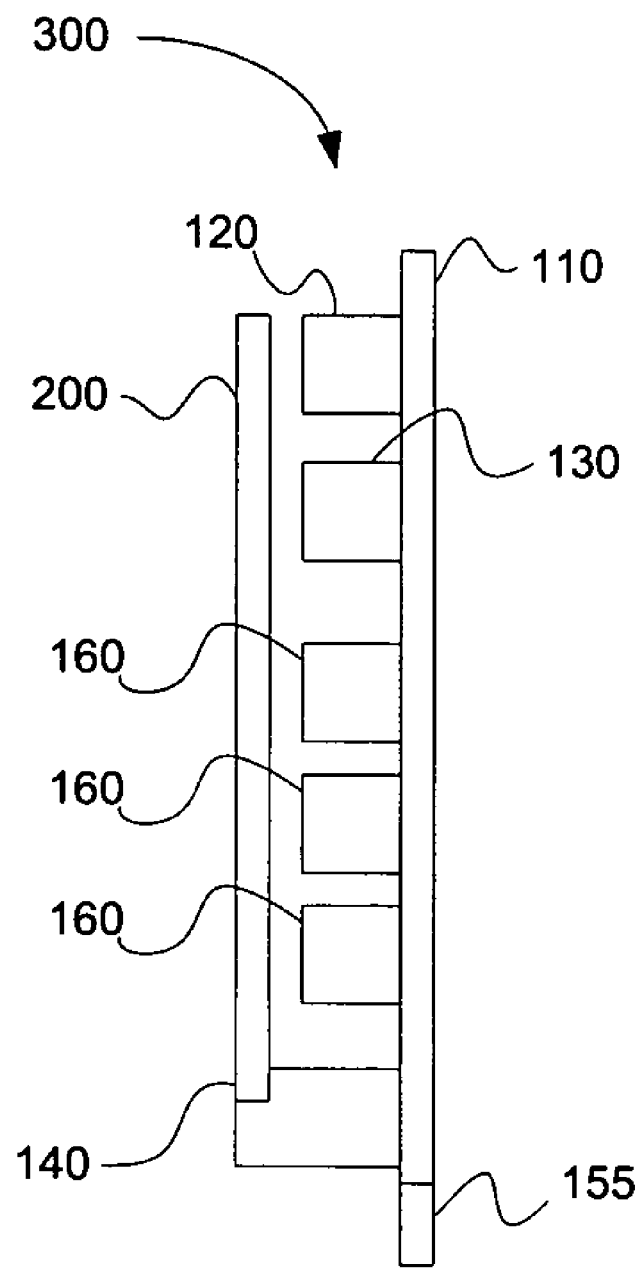
FIG. 4 is a conceptual illustration of a side view of the reconfigurable graphics processing system of FIG. 3, according to one embodiment of the invention; and, FIG. 5 is a conceptual illustration of a computing device configured to implement one or more aspects of the present invention.

FIG. 4 is a conceptual illustration of the side view 400 of the reconfigurable graphics processing system 300 of FIG. 3, according to one embodiment of the invention. This figure illustrates the spatial relationship between the MXM board 200, the MXM edge connector 140 and the interposer board assembly 100. Since the MXM board 200 is held at a fixed distance from the interposer board assembly 100 by the MXM edge connector 140, electrical components 160 and power connectors 120 and 130 may be disposed on the interposer board assembly 100 between the MXM board 200 and the interposer board assembly 100. The electrical components 160 and power connectors 120 and 130 are positioned so that they do not interfere with other elements of the design such as connector mating, heat dissipation, signal integrity or the like.

Figure 5:
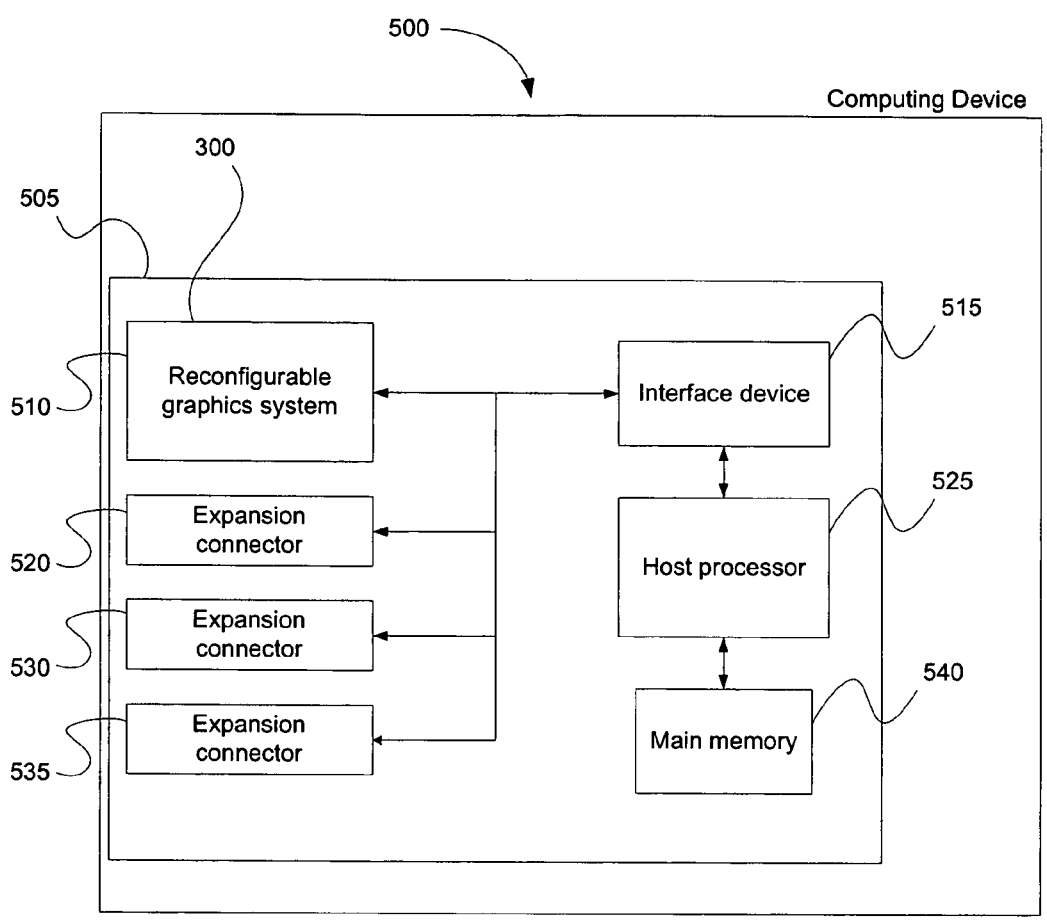

FIG. 5 is a conceptual illustration of a computing device 500 configured to implement one or aspects of the present invention. Computing device 500 may be a desktop computer, server, laptop computer, palm-sized computer, personal digital assistant, tablet computer, game console, cellular telephone, computer-based simulator or any other type of similar computing device. As shown, computing device 500 may include, without limitation, a motherboard 505, a host processor 525, main memory 540, an interface device 515, and expansion connectors 510, 520, 530, and 535, where reconfigurable graphics processing system 300 is coupled to computing device 500 via expansion connector 510. Typically, each expansion connector 510, 520, 530 and 535 supports a single expansion card. In this embodiment, however, the reconfigurable graphics processing system 300 occupies the space allocated for two expansion cards. In alternative embodiments, the reconfigurable graphics processing system 300 may occupy the space allocated for more or less than two expansion cards.

The host processor 525 uses main memory 540 to store data and programs and communicates to the interface device 515. The interface device 515 may be an input/output interface or a bridge device. The interface device 515 is coupled to the expansion connectors 510, 520, 530, and 535. The reconfigurable graphics processing system 300 adds graphics capabilities to computing device 500. As previously described herein, in the preferred embodiment, the reconfigurable graphics processing system 300 is configured to conform to standard PCI Express or AGP graphics card specifications and, therefore, can replace the graphics card typically found in a computing device.

One advantage of the present invention is that the graphics capabilities of the computing device 500 may be easily upgraded. As GPU designs are upgraded, upgraded MXM boards become available and may be used to replace older MXM boards in the reconfigurable graphics processing system 300. Alternatively, an old reconfigurable graphics processing system may be replaced with a new reconfigurable graphics processing system that includes upgraded MXM boards.

While the foregoing is directed to embodiments of the present invention, other and further embodiments of the invention may be devised without departing from the basic scope thereof, and the scope thereof is determined by the claims that follow.

We claim:

1. A graphics processing system, comprising:
   an interposer board configured to connect to a motherboard included in a computing device, wherein the interposer board includes:
   one or more graphics subsystem connectors, wherein each graphics subsystem connector is configured to couple a specific graphics subsystem to the interposer board;
   an interface connector configured to couple the interposer board to the motherboard; and
   a bridge interface that is coupled to the one or more graphics subsystem connectors and to the interface connector and configured to convert a signal protocol associated with the interface connector to a signal protocol associated with the specific graphics subsystems.

2. The graphics processing system of claim 1, wherein each graphics subsystem connector in the one or more graphics subsystem connectors comprises an MXM edge connector.

3. The graphics processing system of claim 1, further comprising a first graphics subsystem coupled to the interposer board via a first graphics subsystem connector in the one or more graphics subsystem connectors, wherein the first graphics subsystem includes a first graphics processing unit coupled to a first graphics board.

4. The graphics processing system of claim 3, wherein the first graphics board is an MXM board.

5. The graphics processing system of claim 3, further comprising a second graphics subsystem coupled to the interposer board via a second graphics subsystem connector in the one or more graphics subsystem connectors, wherein the second graphics subsystem includes a second graphics processing unit coupled to a second graphics board.

6. The graphics processing system of claim 5, wherein the interface connector is configured such that graphics related signals may be transmitted to and from the first graphics subsystem via a first portion of the interface connector and graphics related signals may be transmitted to and from the second graphics subsystem via a second portion of the interface connector.

7. The graphics processing system of claim 5, wherein the first graphics board is a first MXM board, and the second graphics board is a second MXM board.

8. The graphics processing system of claim 1, wherein the bridge interface is further configured to convert the signal protocol associated with specific graphics subsystems to the signal protocol associated with the interface connector.

9. A computing device configured to process graphics data, the computing device comprising:
   a memory;
   a processor; and
   a graphics processing system comprising:
   an interposer board configured to connect to a motherboard included in the computing device, wherein the interposer board includes:
   one or more graphics subsystem connectors, wherein each graphics subsystem connector is configured to couple a specific graphics subsystem to the interposer board;
   an interface connector configured to couple the interposer board to the motherboard; and
   a bridge interface that is coupled to the one or more graphics subsystem connectors and to the interface connector and configured to convert a signal protocol associated with the interface connector to a signal protocol associated with the specific graphics subsystems.

10. The computing device of claim 9, wherein each graphics subsystem connector in the one or more graphics subsystem connectors comprises an MXM edge connector.

11. The computing device of claim 9, wherein the graphics processing system further comprises a first graphics subsystem coupled to the interposer board via a first graphics subsystem connector in the one or more graphics subsystem connectors and a second graphics subsystem coupled to the interposer board via a second graphics subsystem connector in the one or more graphics subsystem connectors.

12. The computing device of claim 11, wherein the interface connector is configured such that graphics related signals may be transmitted to and from the first graphics subsystem via a first portion of the interface connector and graphics related signals may be transmitted to and from the second graphics subsystem via a second portion of the interface connector.

13. The computing device of claim 11, wherein the first graphics board is a first MXM board, and the second graphics board is a second MXM board.

14. The computing device of claim 11, wherein the first graphics subsystem includes a first graphics processing unit coupled to a first graphics board, and the second graphics subsystem includes a second graphics processing unit coupled to a second graphics board.

15. The computing device of claim 9, wherein the bridge interface is further configured to convert the signal protocol associated with specific graphics subsystems to the signal protocol associated with the interface connector.

16. A processing system, comprising:
   an interposer board configured to connect to a motherboard included in computing device, wherein the interposer board includes:
      one or more processing subsystem connectors, wherein each processing subsystem connector is configured to couple a specific processing subsystem to the interposer board;
      an interface connector configured to couple the interposer board to the motherboard; and
      a bridge interface that is coupled to the one or more processing subsystem connectors and to the interface connector and configured to convert a signal protocol associated with the interface connector to a signal protocol associated with the specific processing subsystems;
   a first processing subsystem coupled to the interposer board via a first processing subsystem connector in the one or more processing subsystem connectors, wherein the first processing subsystem includes a first processing unit coupled to a first printed circuit board; and
   a second processing subsystem coupled to the interposer board via a second processing subsystem connector in the one or more processing subsystem connectors, wherein the second processing subsystem includes a second processing unit coupled to a second printed circuit board.

* * * * *